Dec. 23, 1969 YOSHIKAZU YAMADA ET AL 3,485,629

PHOTO PROCESS

Filed July 21, 1966

INVENTORS.
YOSHIKAZU YAMADA
LESTER F.M. STORM

BY. Robert Berliner

ATTORNEY.

United States Patent Office 3,485,629
Patented Dec. 23, 1969

3,485,629

PHOTO PROCESS

Yoshikazu Yamada, Sierra Madre, and Lester F. M. Storm, Pasadena, Calif., assignors to Bell & Howell Company, Chicago, Ill., a corporation of Illinois Filed July 21, 1966, Ser. No. 566,984
Int. Cl. G03f *7/08;* G03c *5/30*
U.S. Cl. 96—33 16 Claims This invention relates to a photo process and more specifically to printing plates and their preparation using compositions that are sensitive to light. More particularly, the invention relates to the preparation of printing plates of the gravure, letter press and planographic, e.g., lithographic, types wherein the characteristics of the surface of the plate are altered as the result of image-wise exposure to actinic light.

Figure 1A:
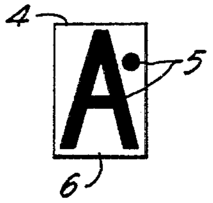

A common method of forming an image on a printing plate involves coating a photosensitive polymeric material onto the plate surface; exposing the polymer through a negative of the image to be reproduced; removing the polymer in the unexposed areas; etching with acid and rinsing. Exposure causes crosslinking of the polymer in the light-struck areas rendering it insoluble in the solvent used to subsequently remove non-light-struck polymer. Etching or washing with acid removes plate material beneath the non-light-struck polymer or changes the surface of the plate sufficiently to change its ink-receptive properties. This process suffers several drawbacks. Removal of the polymer is often difficult, tedious and may damage the printing surface. Also, the tendency of the acid to "creep" under the polymer mask decreases resolution. Further, there is no differential as the techniques are all-or-nothing processes; i.e., light causes formation of a mask (crosslinked polymer) which completely resists the acid and where no light has struck there is no mask and the acid acts without hindrance.

In other processes, a photoresist is applied to a hydrophilic surface, e.g., casein coated paper, methylcellulose impregnated paper, etc. The exposure is carried out through a negative and the unexposed portions are removed by treatment with a suitable solvent. Usually, the exposed portions are ink receptive and the hydrophilic base, being water receptive, is ink repellent.

Many and various photosensitive materials have been used and suggested for use in the preparation of printing plates. The materials described by Wainer in U.S. Patent 3,046,125 are the most pertinent to the present invention. He describes the use of an aryl amine and an organic halogen compound supported in a branched chain paraffin or isoparaffin hydrocarbon wax. The wax formulation is coated on a lithographic plate and exposed wherein an insoluble reaction product is produced in the wax. A resist is produced by washing off the soluble unexposed portion of the wax with a hydrocarbon solvent. The present invention uses similar amines and halogen compounds but is different in other, critical, aspects resulting in a completely different mode of operation. All the above processes are negative-working in that the unexposed portions of the plate coating are altered or removed. In this sense, the present invention involves a positive-working process. In a broader sense, the present invention flexibly allows a positive or negative-working mode.

It is an object of this invention to provide new methods of preparing printing plates of the gravure, letter press and planographic types. It is a further object to provide such plates having a coating thereon which, upon exposure and upon subsequent treatment to be described, alters in the coating in the light-struck areas so as to render the coating ink-receptive in those areas or readily removable in those areas so as to provide either a negative or positive image of the original. Another and further object of this invention is the provision of such a process wherein each type of printing procedure can be made to work in a positive or negative mode. It is a still further object to provide printing plates which are inexpensive and readily utilized. Other objects of this invention will become apparent from the following description.

The above and other objects are accomplished by providing a method for preparing a printing plate which comprises exposing to actinic light a photosensitive material dispersed in a water penetrable continuous phase in which the material is substantially insoluble, and treating the continuous phase with a solution comprising substantial amounts of (1) water and (2) an organic solvent having significant miscibility in water, the photosensitive material being such as to react to the exposure to alter the physical structure of the continuous phase in the exposed portions thereof when treated with the solution. A printing plate is produced containing an image in the continuous phase in the form of rough or reticulated areas. The unexposed hydrophilic areas are smooth and normally ink-repellent; the reticulated areas are ink-receptive allowing printing by the planographic method.

In a further embodiment of this invention, the water penetrable continuous phase is contained on a support and exposed portions of the continuous phase are removed from the support by simple water washing after the application to the continuous phase of the above aqueous organic solvent solution. In this case, printing can be accomplished by the gravure procedure wherein ink is retained in the recesses representing the image in the more continuous background surface. Alternately, an image of opposite mode can be obtained by the letter press method by either using a support that is hydrophobic and ink that is hydrophilic or else treating the remaining coated areas to render them hydrophobic-ink-receptive, with the base being hydrophilic.

Thus, a degree of flexibility is available with the present invention that is not available with prior methods. This flexibility is compounded even further in more specific embodiments which have other advantages that are not present to any practical extent in prior methods. Thus, in certain particular embodiments of this invention, the photosensitive material is capable, in the environment of the continuous water penetrable phase, of undergoing either a positive or negative mode of reaction. Accordingly, the choice of modes available for printing is doubled with these particular embodiments, which will be more fully described below.

The photosensitive material used in our processes are dispersed in the form of discrete globules in a continuous water-penetrable phase in which the combination is substantially insoluble. Such dispersions are discussed in detail in an application of Yoshikazu Yamada and Thomas H. Garland, Ser. No. 481,759, filed Aug. 23, 1965, entitled "Production and Use of Photosensitive Compositions and Films." Generally, a solid-film-forming component is used to achieve the continuous phase and may be any of a number of generally photographically inert materials, which are, in most cases, soluble in water or so finely dispersible therein in the concentrations of use that for practical purposes there is no distinction between solution and dispersion for these materials in the continuous phase. Such materials include the starch and starch derivatives, proteins (i.e., casein, zein, gelatin, thiolated gelatin, etc.), alginates, gums, and the like materials which are generally considered to be natural derivatives of natural film-forming materials, any one of which in its conventional "water-soluble" form is used in the practice of the instant invention. In addition, synthetic water-soluble film-formers may also be used to particular advantage in the practice of the invention and such materials include polyvinyl alcohol, commercially available water-soluble polyacrylics or acrylates (i.e., water-soluble polyacrylic acid salts having substantially the molecular weight and water compatibility of the polyvinyl alcohol), various commercially available amine or amine-aldehyde resins, etc. Also, a number of cellulose derivative film-formers may be used, and these include the various water-soluble cellulose ethers, carboxymethylcellulose, hydroxypropylmethylcellulose, etc. Essentially these materials are photo-insensitive and their principal function is that of forming the desired continuous phase which will retain the dispersed phase in discrete particle form. Of the above materials, gelatin, casein, polyvinyl alcohol, gum arabic, starch, alkali metal carboxymethylcellulose (e.g., sodium carboxymethylcellulose) and hydroxyethylcellulose are particuarly useful in this invention.

After exposure, the water-penetrable phase is treated with an aqueous organic solvent solution, thereby reticulating the exposed portions. Any of the common organic solvents that have significant miscibility in water can be used, the term "significant" referring to a miscibility that is sufficient to allow a reticulating amount of organic solvent in the solution. Enough water should be present to allow the solution to penetrate the continuous phase and enough organic solvent should be present to alter or reticulate the continuous phase in the exposed areas within a reasonable time. In general, the solution contains from about five, preferably about 10, to about 95 volume percent of water and immersion is for from about a few seconds to a minute or more. Suitable aqueous organic solvent solutions can include the following or mixtures thereof: ethanol, methanol, isopropanol, ether, benzene, octane, glycerol, chloroform, acetic acid, ethyl acetate, carbon tetrachloride, carbon disulfide, dimethylsulfoxide, and the like, and of particular effectiveness, acetone, m-dioxane, p-dioxane, tetrahydrofuran, and the like. It is, of course, known that benzene, octane, chloroform, carbon tetrachloride and carbon disulfide are not soluble or miscible with water but they could be utilized in a ternary system mixed with an organic solvent which is miscible, e.g., acetone.

The solution can optionally contain a dye, such as Crystal Violet, that colors the reticulated areas so as to present a readily readable image (and also colors the background, but allows a clearer distinction). The solution can optionally contain a desensitizer, to stabilize the continuous phase against color erosion and background darkening. Examples of desensitizers include sodium metabisulfite, sodium sulfite, potassium sulfite, sodium bisulfite, potassium bisulfite, acetone-sodium bisulfite, urea peroxide, sodium perchlorate, sodium perborate, tert-butyl peroxide, hydroquinone monomethyl ether, mixtures thereof, and the like.

In a preferred embodiment of the invention, the photosensitive material is a combination of at least two starting agents, (a) and (b), one of which, (a), is an organic halogen compound. The organic halogen compounds useful in our processes are selected from the group of compounds which produce free radicals or ions upon exposure to light of a suitable wavelength and in which there is present at least one active halogen selected from the group consisting of chlorine, bromine and iodine, attached to a carbon atom having not more than one hydrogen atom attached thereto. Compounds of this preferred group are described in U.S. Patents 3,042,515, 3,042,516 and 3,042,517 and the descriptions and disclosures of these patents are hereby incorporated by reference. Examples of suitable organic halogen compounds include bromotrichloromethane, bromoform, iodoform, 1,2,3,4-tetrabromobutane, tribromoacetic acid, 2,2,2-tribromo-ethanol, tetrachlorotetrahydronaphthalene, 1,1,1-tribromo-2-methyl-2-propanol, carbon tetrachloride, p-dichlorobenzene, 4-bromobiphenyl, 1-chloro-4-nitrobenzene, p-bromoacetanilide, 2,4-dichlorophenol, 1,2,3,4-tetrachlorobenzene, 1,2,3,5-tetrachlorobenzene, brominated polystyrene, n-chlorosuccinimide, n-bromosuccinimide, 2-chloroanthraquinone, tetrabromophenolphthalein, tetrabromo-o-cresol, and the like. Particularly effective compounds include carbon tetrabromide, tribromochloromethane, dibromodichloromethane, pentabromoethane, hexachloroethane and hexabromoethane. In general, bromides are preferred.

Optionally, a dye sensitizer may be present with the photosensitive material which extends the spectral sensitivity of the combination. Examples of such sensitizers include the rhodamine dyes and dye bases; the pinacyanol and related carbocyanin or cyanine-type dyes and dye bases such as pinaflavole, ethyl red, quinaldine red and neocyanine; the eosin and erythrosin dyes and dye bases; the triphenylmethane dyes and dye bases such as crystal violet and malachite green; the thiazine dyes and dye bases such as methylene blue and thionine; the anthraquinonoid dyes and dye bases such as alizarin; the acridine dyes and dye bases such as acridine orange; the styryl (including azastyryl) dyes and dyes bases such as 4-(p-dimethylaminostyryl)quinoline dye or dye bases; and the like.

When a dye or dye base sensitizer is used, particularly effective organic halogen compounds are those having the formula $Br—C—(X)\ (X')\ (X'')_n(CY_3)_{1-n}$ wherein X, X' and X'' are halogens, each Y is independently selected from the group consisting of halogen, hydrogen, hydroxy, methyl and methylol and $n$ is selected from 0 and 1, such that when $n$ is 0, X and X' are Br.

In other preferred embodiments, the other starting agent (b) is a nitrogen atom-containing compound having certain structural characteristics. Thus, our processes are particularly suitable when the nitrogen-containing compound has a nitrogen atom attached directly to at least one benzene ring, the benzene ring being free from carbon atom substitution in the position para to the nitrogen atom attachment. The process is also particularly suitable with nitrogen-containing compounds in which the nitrogen atom is a member of a heterocyclic ring. Still another type of nitrogen-containing compound with which the process is particularly useful is an N-vinyl compound.

It will be appreciated that there is substantial overlap between the above types of nitrogen-atom-containing compounds and that the process is useful with photosensitive combinations that are formulated with nitrogen-containing compounds falling within one, two or even all three of the above terms; e.g., N-vinylcarbazole. It will also be appreciated that there is no generic term available in accepted chemical terminology that will effectively embrace all of the above types of nitrogen-containing compounds. It is merely important to note that photosensitive combinations containing a compound which has at least one of the above characteristics are readily applicable to these processes. Photosensitive combinations containing compounds having more than one of the above characteristics lend themselves even better to these processes. Examples of particularly effective nitrogen-containing compounds include N-vinylcarbazole, N-ethylcarbazole, indole and diphenylamine.

The use of nitrogen-containing compounds, particularly N-vinyl compounds, as part of the photosenitive combination is also described in detail in the above-noted Yamada and Garland application, as well as in the above-cited Wainer patent. In a preferred embodiment an N-vinyl compound is used and an additional degree of flexibility thereby inures to our processes. In the environment of the continuous phase the combination of organic halogen and N-vinyl compound is capable of undergoing two separate and distinct reactions on exposure to actinic light. In one reaction, in a negative working mode, an "altering" product is formed in light-struck areas which alters, i.e., reticulates, the continuous phase when it is treated as above with the aqueous organic solvent. In another reaction, in a positive working mode, "weaker" light is used initially and a polymer is thought to be first formed which is not an "altering" product; subsequent blanket exposure to "stronger" light, forms an "altering" product in the initial non-light-struck areas, but has no such effect on the initially light-struck areas. Thus, by initial exposure to relatively "weaker" light, alteration in those areas is prevented. These two reactions are competitive, the kinetics of which say that one or the other will predominate depending on the wavelength-intensity-exposure of light, with the "non-altering" polymer-forming reaction occurring with "weaker" light. In general, about one magnitude or more of exposure to "strong" light is needed to form an "altering" product with the nitrogen-atom-containing compounds that do not have an N-vinyl group. On the other hand, N-vinyl compounds generally require a post-exposure heat step, whereas the other compounds generally do not.

In general, the weight ratios of the nitrogen-containing and halogen compound starting agents, (b) and (a) respectively, may vary widely, from a minimum practical weight ratio of (b):(a) of about 1:5 to a maximum ratio of about 50:1. If the proportion of halogen compound used is greater than that specified in the foregoing range, it is ordinarily found that no practical advantage is obtained, and, in general, the weight ratio of (b):(a) used is not below about 1:2 except in special situations wherein losses of a halogen compound (e.g., carbon tetrabromide) are contemplated prior to the actual use. Also, if the amount of halogen compound used is less than the minimum just specified, the combination may be inadequately photosensitive. When a combination of two or more organic halogen compounds are used in the practice of the instant invention in a continuous water-penetrable phase, it has been found that advantages are obtained often in the use of weight ratios of 5:1 to about 20:1.

With regard to the relative weights of (1) the solid compounds (a) and (b) in the dispersed phase compared to (2) the solids in the continuous phase, it is found that the solids weight ratio of (1):(2) is preferably about 1:2, but may range from a maximum practical ratio of about 5:1 to a practical minimum ratio of about 1:50. The continuous phase may be 100% "solids" in the sense that the entire system solidifies without any loss of water, but generally the solids-to-liquid ratio in the continuous phase is within the range of about 1:1 to about 1:30.

Preferably, also the dispersed phase particles are in the range of about 0.1 to above 20 microns, but the preferred range is about 0.3 to 10 microns, with an average particle size preferably of about 3 to 4 microns.

Further descriptions and examples of nitrogen atom-containing compounds, organic halogen compounds, dispersing mediums and other facets of compositions that can be desensitized by our process are given in the Yamada and Garland application referred to above, the disclosure of which is hereby incorporated by reference.

Figure 1B:
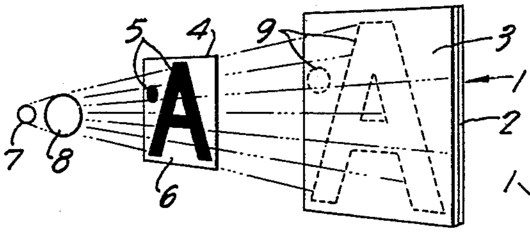
Figure 1C:
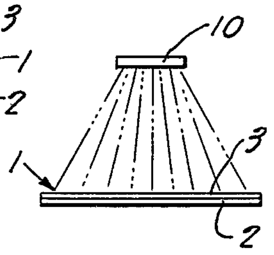
Figure 2A:
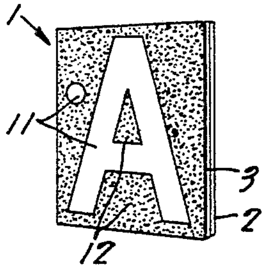
Figure 2B:
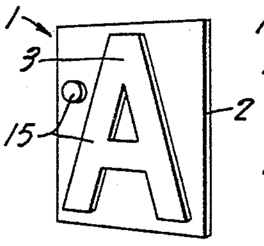
Figure 2C:
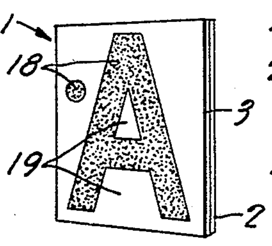
Figure 2D:
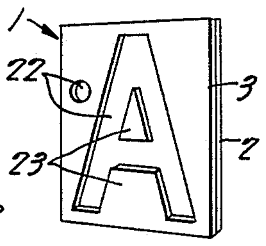
Figures 3A, 3B, 3C, 3D:
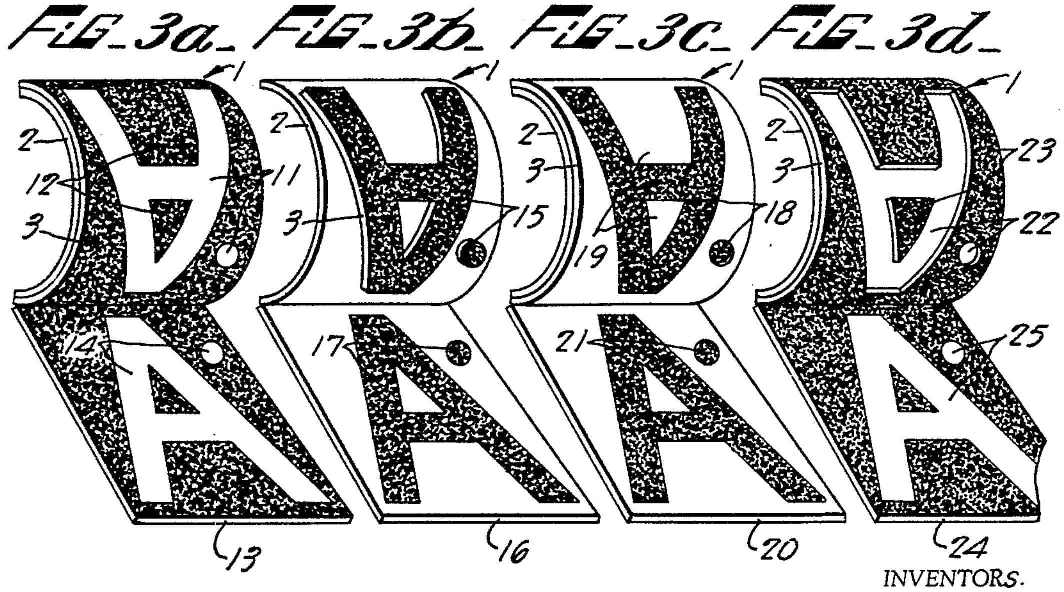

In order to facilitate a better understanding of the invention, detailed descriptions of specific aspects will be given with reference to the drawings, in which:

FIGS. 1*a* and 1*b* schematically show an image-wise exposure of a printing plate of this invention;

FIG. 1*c* shows a further, blanket, exposure of the plate of FIG. 1*b* with a different wavelength-intensity-exposure of light, in accordance with the positive-mode embodiments of this invention;

FIGS. 2*a–b* schematically show various types and forms of printing plates obtained by the practice of this invention;

FIGS. 3*a–b* schematically show the images obtained using the plates of FIGS. 2*a–d*.

Referring to FIGS. 1*a* and 1*b*, a printing plate 1 is shown having a support 2 with an ink-repellent hydrophilic surface such as casein coated paper, methyl cellulose impregnated paper, and the like, and a layer 3 comprising a water penetrable continuous phase containing a photosensitive material that is substantially insoluble in the continuous phase and which is dispersed therein in the form of discrete globules.

The following examples, with reference to the figures, will illustrate various embodiments of the invention:

EXAMPLE 1

In a preferred embodiment the layer 3 is prepared with N-vinylcarbazole and an organic halogen, i.e., as with the following formulation:

| | | |
|---|---|---|
| Aqueous gelatin, 20% | ml | 50 |
| N-vinylcarbazole | g | 4 |
| Carbon tetrabromide | g | 3.2 |
| Ethyl acetate | ml | 2.4 |
| Aerosol 0T, 37.5% | drops | 8 |

The N-vinylcarbazole and carbon tetrabromide are dissolved in the ethyl acetate which is added to the gelatin solution; the other ingredients are added and the mixture is stirred until a uniform dispersion is achieved. Aerosol 0T is present to aid dispersion, and is optional. The ethyl acetate can also be omitted, with more vigorous agitation required. The formulation is coated on the plate, 0.003" wet thickness, and dried gently at 24° C. The formulation is of a preferred type, capable of undergoing either a negative or positive mode reaction, depending on initial exposure.

A positive microfilm frame 4, shown right reading in FIG. 1*a*, and containing information to be printed as opaque areas 5 on transparent areas 6, is spaced between and facing the continuous phase 3 and light source 7 and lens 8. An expanded positive image 9 of opaque areas 5 is projected onto the continuous phase 3 by exposure of film 4 to light from source 7 at 8× magnification.

In the present example, with a "negative" mode of operation, light source 7 is of relatively high intensity, e.g., a 275 watt G.E. sunlamp at about 15 inches. Exposure is for about 10 seconds. The plate 1 is heated at about 70° C. for about 10–15 seconds and then blanket exposed with light of a relatively low intensity, in this case ordinary fluorescent room light. Alternatively, the light source 10 of FIG. 1*c* can be used where that light source is of relatively low intensity, e.g., a Bell & Howell slide projector with a 300 watt lamp at about 3 feet, for about 5 seconds.

Referring to FIG. 2*a*, the plate 1 is treated with a solution comprising substantial amounts of (1) water and (2) an organic solvent having significant miscibility in water, in this case a 15:85 volume percent acetone: water solution, by immersing plate 10 in the solution for about 10–15 seconds. The solution has the effect of reticulating the surface of those portions of the continuous phase 3 that were subjected to the relatively high intensity exposure. On the other hand, those areas that were not subjected to the high intensity exposure, remain smooth. Accordingly, a printing plate results having non-ink-receptive areas 11 corresponding to the opaque areas 5 of the microfilm 4 and ink-receptive reticulated areas 12 corresponding to the transparent areas 6. Referring to FIG. 3*a*, the plate 1 is inked, e.g., with a solution of oil soluble nigrosine in mineral oil, the ink adhering to the reticulated surface areas 12, but not to the smooth areas 11 and, after contacting paper 13, leaves an expanded printed negative copy 14 of opaque areas 5.

EXAMPLE 2

Layer 3 is prepared and exposed as in Example 1. Referring to FIG. 2*b*, an alternate method of obtaining a printing plate, subsequent to the above method of exposure, is shown. The plate 1 is treated with the aqueous organic solvent solution, as in Example 1, but in this procedure the surface of the plate 1 is then washed with water and rubbed to remove those portions of the continuous phase 3 which were subjected to the relatively high intensity light. In other words, instead of just leaving a reticulated surface, the plate is somewhat vigorously water-washed to remove the reticulated portions from the support 2. Instead of water, the solvent solution can be used, but plain tap water will suffice. Those areas of the continuous phase 3 which were subjected only to the blanketing relatively low intensity light are not removed by this procedure. Thus, a letter press type of plate is produced in the form of a relief image 15 of the opaque areas 5 on the support 2. Plate 1 can be further treated by washing the surface with a hardening agent, such as alum, to set and harden the image areas 15 and make them ink-receptive. Referring to FIG. 3*b*, the plate 1 is then inked, the ink adhering to the image 15 but not to the ink-repellent surface of the support 2, and after contacting paper 16, leaves an expanded positive copy 17 of opaque areas 5.

EXAMPLE 3

Layer 3 is prepared as in Example 1. In a second, "positive" mode of operation, and again referring to FIG. 1*b*, light source 7 is of a relatively low intensity, e.g., a Bell & Howell slide projector with a 300 watt lamp at about 3 feet. Exposure is for about 2–3 seconds. The plate is heated at about 70° C. for about 5 seconds and, again referring to FIG. 1*c*, is then blanket exposed, in this case, with light source 10 of a relatively high intensity, in this case a sun gun at about 14 inches for about 2 seconds. The plate 1 is then heated to about 70° C. for about 10 seconds.

Referring to FIG. 2*c*, plate 1 is treated in a manner similar to the treatment described in FIG. 2*a*, Example 1; that is by immersion in the aqueous organic solvent solution of acetone and water for about 10–15 seconds. The initial exposure to low intensity light and subsequent heating deactivates the areas so exposed so that on subsequent blanket exposure to high intensity light those areas do not reticulate when treated with the solution, but remain smooth. On the other hand, those areas that are not subjected to the imaging low intensity light receive only the high intensity exposure and this exposure serves to alter the physical structure of the continuous phase so that the surface in those areas is reticulated by treatment with the solution. Accordingly, a printing plate results, completely opposite to the plate of FIG. 2*a*, Example 1, having reticulated ink-receptive areas 18 corresponding to the opaque areas 5 of the microfilm 4 and non-ink-receptive areas 19 corresponding to the transparent areas 6. Referring to FIG. 3*c*, the plate 1 is inked, the ink adhering to the reticulated surface areas 18 but not to the smooth areas 19 and, after contacting paper 20, leaves an expanded positive copy 21 of opaque areas 5.

EXAMPLE 4

Layer 3 is prepared and exposed as in Example 3. Referring to FIG. 2*d*, another alternate method of obtaining a printing plate, subsequent to the above second method of exposure, is shown; treatment after exposure is similar to the method described with reference to FIG. 2*b*, Example 2. The plate 1 is treated with the aqueous organic solvent solution of acetone and water, the surface of the plate 1 being washed with water or with the solution and rubbed to remove those portions of the continuous phase 3 which were not subjected to the initial relatively low intensity exposure. Those areas of the continuous phase 3 which were subjected to the relatively low intensity light are not removed by this procedure. Thus, a gravure type of plate is produced in the form of a depressed image 22 of the opaque areas 5 on the support 2. Here, too, plate 1 can be further treated by washing the surface with a hardening agent, such as alum, to set and harden the non-image areas 23 and make them ink-receptive. Referring to FIG. 3*d*, the plate 1 is then inked, the ink adhering to the non-image higher areas 23, but not to the ink-repellent image area surface 22 of the support 2 and, after contacting paper 24, leaves an expanded negative copy 25 of apaque areas 5.

The above-described coated plates should, of course, be handled under a safe-light, e.g., a yellow safe-light, until, in the case of the negative mode, after the initial high intensity exposure, or, in the case of the positive mode, after the blanket exposure of FIG. 1*c* and heat step. They may be handled in room light during treatment with the solution.

FIGS. 1*a*–3*d* were described with reference to plates coated with a preferred formulation, i.e., containing an N-vinyl compound capable of undergoing two competitive, tone-reversed, reactions. The methods of FIGS. 2*c*, 2*d*, 3*c* and 3*d* are particularly applicable with such preferred formulations, but not with formulations in which only an "altering" product is formed, e.g., formulations containing diphenylamine. The methods of FIGS. 1*a*, 1*b*, 2*a*, 2*b*, 3*a* and 3*b*, omitting the step of FIG. 1*c*, are applicable to single product formulations as well as the preferred formulations. In these latter cases a blanketing exposure is not required, nor is it desired unless a preferred formulation is used and a positive mode is desired; however, the plates should be desensitized or treated with the solution under a safe-light.

EXAMPLE 5

Referring again to FIGS. 1*a* and 1*b*, the formulation of Example 1 is coated on plate 1, as layer 3, but diphenylamine is used in place of N-vinylcarbazole. Plate 1 is exposed for about 3 minutes through the microfilm frame 4 to the light source 7 used in Example 1. The plate is then immersed in the aqueous organic solvent solution to yield a plate 1 of FIG. 2*a*, as in Example 1, or subsequently washed and rubbed with water or the solution to yield a plate 1 of FIG. 2*b*, as in Example 2.

EXAMPLE 6

Following the procedure of Example 1, N-vinylcarbazole and carbon tetrabromide can be dispersed in continuous phases of gelatin, caselin, polyvinyl alcohol, gum arabic, starch, sodium carboxymethylcellulose and hydroxyethylcellulose. The formulations can be coated on the support 2 and exposed and heated with relatively high intensity light as in Example 1 to form negative mode images thereon. The plates can then be immersed for about 2 minutes into a 50:50 volume percent acetone:water solution containing a desensitizer. Thus, the plates can be dipped into such solutions containing 0.1 weight percent sodium metabisulfite, 0.2 weight percent acetone- sodium bisulfite, 0.4 weight percent tert-butyl peroxide, or 2 weight percent hydroquinone monomethyl ether, to desensitize the non-light-struck areas. Printing plates result in which the light-struck areas are reticulated and ink-receptive and the non-light-struck areas smooth and non-ink-receptive.

EXAMPLE 7

The procedure of Example 1 can be followed, except using separate aqueous gelatin dispersions of N-vinylcarbazole and tribromochloromethane, pentabromethane, hexachloroethane, bromotrichloromethane, p-dichlorobenzene and 2,2,2-tribromoethanol as the photosensitive continuous phase 3, to yield printing plates of this invention.

EXAMPLE 8

The procedure of Example 5 can be followed, except using separate aqueous geltin dispersions of carbon tetrabromide and N-ethylcarbazole, indole, benzylthiazoline and benzoxyazoline as the photosensitive continuous phase 3, to yield printing plates of this invention.

EXAMPLE 9

The procedure of Example 1 can be followed, except using the following aqueous-organic solvent solutions in place of the acetone:water solution: a 50:50 volume percent solution of methanol:water, a 30:70 volume percent solution of tetrahydrofuran:water, a 5:55:40 volume percent solution of benzene:ethanol:water, a 40:50:10 volume percent solution of methanol:ether:water, a 5:40:55 volume percent solution of p-dioxane:acetone:water or a 10:60:30 volume percent solution of m-dioxane:methanol:water, to reticulate the continuous phase 3 and yield printing plates of this invention.

It will be understood that modifications and variations may be effected without departing from the scope of the novel concepts of the present invention.

We claim:

1. A method for preparing a printing plate which comprises:
 (1) providing a plate comprising a support with a coating consisting essentially of;
  (a) an organic halogen compound selected from the group of compounds which produce free radicals or ions upon exposure to light of a suitable wavelength and in which there is present at least one active halogen selected from the group consisting of chlorine, bromine, and iodine, attached to a carbon atom having not more than one hydrogen atom attached thereto,
  (b) an N-vinyl compound, and
  (c) a hydrophilic film forming binder;
 (2) photographically exposing said plate; and
 (3) treating said binder with an aqueous solution of a water-miscible organic solvent to produce a reticulated image thereon to enable the printing therefrom of reproductions of said image.

2. The method of claim 1 wherein the N-vinyl compound is N-vinyl carbazole.

3. A method of claim 1 wherein said N-vinyl compound is capable of positive mode and negative mode light exposure reactions with said organic halogen compound.

4. The method of claim 3 wherein said plate is photographically exposed to desensitizing light and including the subsequent step, prior to said treatment, of blanket exposing said plate to light sufficient to effect said negative mode reaction in portions thereof not disensitized whereby said treatment rectiulates portions of said binder exposed in said negative mode but does not substantially physically alter portions of said binder exposed in said positive mode.

5. The method of claim 3 wherein said plate is photographically exposed to light sufficient to effect said negative mode reaction whereby said treatment reticulates portions of said binder exposed in said negative mode.

6. The method of claim 1 wherein said reticulated binder portions are removed from the support.

7. The method of claim 1 wherein the aqueous solution contains a desensitizer for the photosensitive material.

8. The method of claim 1 wherein the binder is selected from the group consisting of gelatin, casein, polyvinyl alcohol, gum arabic, starch, alkali metal carboxymethylcellulose and hydroxyethylcellulose.

9. The method of claim 1 wherein the binder is geltain, the organic halogen compound is carbon tetrabromide and the N-vinyl compound is N-vinyl carbazole.

10. A printing plate comprising a support with a coating consisting essentially of the photochemical reaction products available from an image-wise exposure of a mixture of (a) an organic halogen compound selected from the group of compounds which produce free radicals or ions upon exposure to light of a suitable wavelength and in which there is present at least one active halogen selected from the group consisting of chlorine, bromine, and iodine, attached to a carbon atom having not more than one hydrogen atom attached thereto, and (b) an N-vinyl compound, dispersed in a hydrophilic binder in which the ink receptive areas are defined by reticulated portions of said binder, said alteration having been made by treatment of said binder with an aqueous solution of water-miscible organic solvent.

11. The plate of claim 10 wherein said N-vinyl compound was N-vinyl carbazole.

12. The plate of claim 10 wherein said N-vinyl compound was capable of positive mode and negative mode light exposure reactions with said organic halogen compound.

13. The plate of claim 12 in which said photochemical reaction products are available from an exposure made with desensitizing light followed by blanket exposure of said plate to light sufficient to effect said negative mode reaction in portions thereof not desensitized, said treatment having reticulated portions of said binder exposed in said negative mode but not portions of said binder exposed in said positive mode.

14. The plate of claim 12 in which said photochemical reaction products are available from an exposure made with light sufficient to effect said negative mode reaction, said treatment having reticulated said portions of said binder exposed in said negative mode.

15. The printing plate of claim 10 wherein the binder is selected from the group consisting of gelatin, casein, polyvinyl alcohol, gum arabic, starch, alkali metal carboxymethylcellulose and hydroxyethylcellulose.

16. The printing plate of claim 10 wherein the binder is gelatin, the organic halogen compound is carbon tetrabromide and the N-vinyl compound is N-vinyl carbazole.

References Cited

UNITED STATES PATENTS

| | | | |
|---|---|---|---|
| 2,532,866 | 12/1950 | Toland et al. | 96—33 X |
| 3,046,125 | 7/1962 | Wainer | 96—35.1 |
| 3,046,126 | 7/1962 | Sus et al. | 96—36.3 |
| 3,055,758 | 9/1962 | McDonald | 96—33 X |
| 3,143,423 | 8/1964 | Reynolds et al. | 96—35.1 X |
| 3,222,174 | 12/1965 | Rott et al. | 96—36 |
| 3,374,094 | 3/1968 | Wainer et al. | 96—33 |
| 3,334,584 | 8/1967 | Sites | 96—33 X |

OTHER REFERENCES

"The Focal Encyclopedia of Photography," 1965, Focal Press, p. 1286.

GEORGE F. LESMES, Primary Examiner

R. E. MARTIN, Assistant Examiner

U.S. Cl. X.R

96—36.3